(12) United States Patent
Inoue

(10) Patent No.: US 7,230,861 B2
(45) Date of Patent: Jun. 12, 2007

(54) SEMICONDUCTOR INTEGRATED CIRCUIT

(75) Inventor: Kazutoshi Inoue, Tokyo (JP)

(73) Assignee: Sony Corporation (JP)

( * ) Notice: Subject to any disclaimer, the term of this patent is extended or adjusted under 35 U.S.C. 154(b) by 106 days.

(21) Appl. No.: 11/248,290

(22) Filed: Oct. 13, 2005

(65) Prior Publication Data

US 2006/0107142 A1  May 18, 2006

(30) Foreign Application Priority Data

Oct. 15, 2004 (JP) ............................ P2004-301188

(51) Int. Cl.
*G11C 29/00* (2006.01)
(52) U.S. Cl. .................. 365/189.12; 365/201
(58) Field of Classification Search ........... 365/189.12, 365/240
See application file for complete search history.

(56) References Cited

U.S. PATENT DOCUMENTS 5,301,156 A * 4/1994 Talley ......................... 365/201
5,448,525 A * 9/1995 Sturges ....................... 365/201
6,246,618 B1 * 6/2001 Yamamoto et al. ......... 365/200
6,445,627 B1 * 9/2002 Nakahara et al. ........... 365/200

* cited by examiner

*Primary Examiner*—Tan T. Nguyen
(74) *Attorney, Agent, or Firm*—Rader Fishman & Grauer PLLC; Ronald P. Kananen

(57) ABSTRACT

A semiconductor integrated circuit for performing processing relating to a test of a plurality of memory units provided therein while suppressing an increase of a circuit area is provided, wherein testing input data generated in a testing circuit is shifted successively on registers of a first data shift circuit formed by scan flip-flops and transferred to each memory unit when carrying out a test on a plurality of memory units, and testing output data in accordance with the testing input data is shifted successively on registers of a second data shift circuit formed by using scan flip-flops and retrieved by the testing circuit.

13 Claims, 9 Drawing Sheets

FIG. 3A CLOCK SIGNAL CK 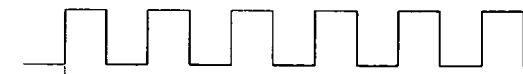
FIG. 3B TESTING INPUT (BT1) 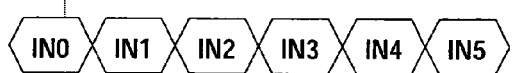
FIG. 3C TESTING INPUT (1_1) 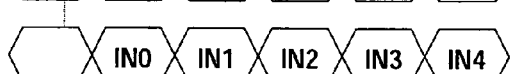
FIG. 3D TESTING INPUT (1_2) 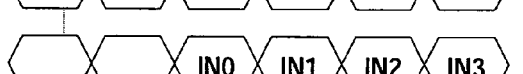
FIG. 3E TESTING INPUT (1_3) 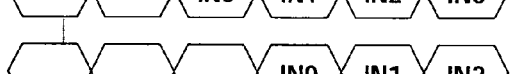
FIG. 3F TESTING OUTPUT (1_1) 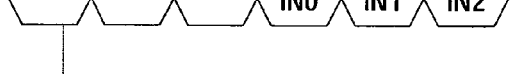
FIG. 3G TESTING OUTPUT (1_2) 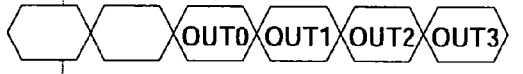
FIG. 3H TESTING OUTPUT (1_3) 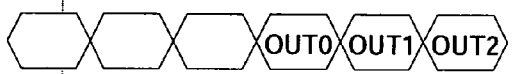
FIG. 3I TESTING OUTPUT (BT1) 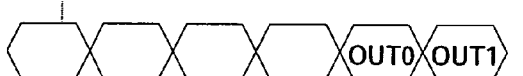

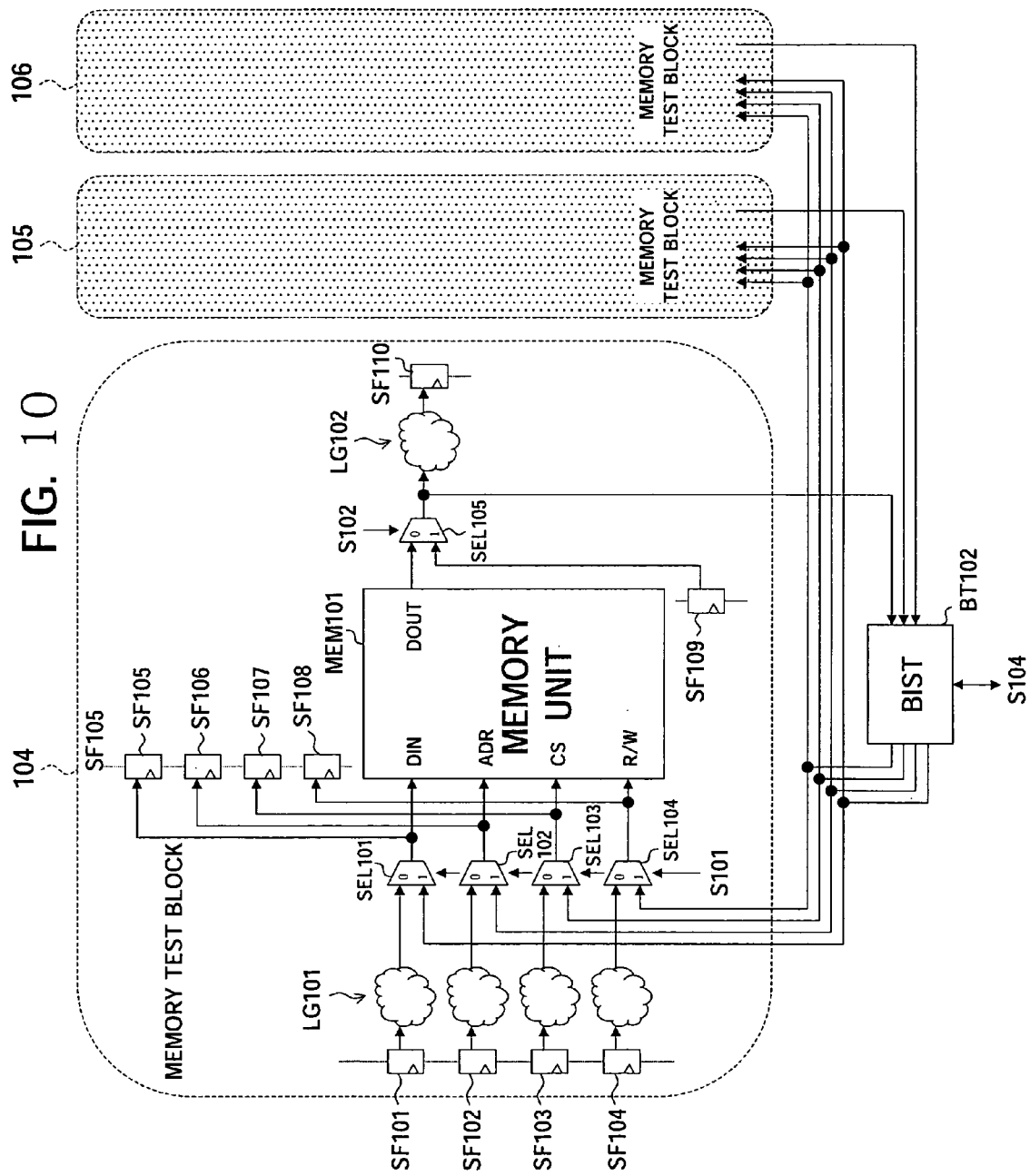

SEMICONDUCTOR INTEGRATED CIRCUIT

CROSS REFERENCES TO RELATED APPLICATIONS

The present invention contains subject matter related to Japanese Patent Application JP 2004-301188 filed in the Japanese Patent Office on Oct. 15, 2004, the entire contents of which are incorporated herein by reference.

BACKGROUND OF THE INVENTION

1. Field of the Invention

The present invention relates to a semiconductor integrated circuit on which an SRAM or other memory and a logic circuit are mounted together.

2. Description of the Related Art

A semiconductor integrated circuit of a type called a system on chip (SoC), wherein a function block divided to a plurality of semiconductor chips are integrated on one semiconductor chip, has emerged as the processing dimensions of a semiconductor circuit have become finer.

Particularly, in recent years, in the field of portable electronic equipment which is highly demanding in terms of the size and costs, a semiconductor integrated circuit wherein a high speed memory, such as a SRAM and a DRAM, and a logic circuit are mounted together has come to be widely used.

On the other hand, however, due to the processing dimensions becoming finer and the integrated rate becoming improved, it has become extremely difficult to produce all the bits of a semiconductor memory without any defects. Therefore, an effective test for finding a defect in memories mounted on the semiconductor integrated circuit has been desired.

Generally, a scan test is known as a testing method of a logic circuit of a semiconductor integrated circuit.

In a semiconductor integrated circuit for carrying out the scan test, a shift register called a scan path circuit is mounted in advance. The scan path circuit is connected to an input or output of a logic circuit to be tested and allows an input/output signal of the logic circuit to pass through in a normal operation, so that it does not affect a logical function. On the other hand, when carrying out a scan test, the scan path circuit latches a test pattern serially transferred from the outside of the semiconductor integrated circuit and inputs the same to the logic circuit to be tested. Then, the scan path circuit retrieves a signal output from the logic circuit in accordance with the test pattern and serially transfers the same to the outside of the semiconductor integrated circuit.

In the scan test method as above described, a test pattern has to be serially transferred every time to obtain one test result (a set of input data and output data), so that when it is applied to a test of a mixed mounted memory on the semiconductor integrated circuit, it brings a disadvantage that the test time becomes very long.

Thus, a method of mounting a memory testing circuit inside the semiconductor integrated circuit in advance to generate a test pattern and conduct a test of output data in the testing circuit is normally used. The method of mounting a self testing circuit inside the semiconductor integrated circuit is generally called a built in self test (BIST).

FIG. 9 is a view of an example of the configuration of a semiconductor integrated circuit of the related art, wherein a plurality of memory units and the testing circuits are mounted together.

The semiconductor integrated circuit shown in FIG. 9 has memory test blocks 101, 102 and 103 as circuit blocks relating to the memory test.

The memory test blocks 101 to 103 respectively include a memory unit MEM 101, such as a SRAM, logic circuits LG101 and LG102 connected to an input and output of the memory unit MEM1, scan flip-flops SF101, . . . , SF110, selectors SEL101, . . . , SEL105, and a memory testing circuit BT101.

At a normal operation, the memory unit MEM101 receives as an input an output signal of the logic circuit LG101 (write data DIN, address data ADR, a chip selection signal CS and a read/write selection signal RW) via the selectors SEL101 to SEL104. Also, read data DOUT of the memory unit MEM101 is output to the logic circuit 102 via the selector SEL105.

The scan flip-flops SF101 to SF110 and other not shown scan flip-flops compose a scan path circuit.

When carrying out a scan test, the logic circuit LG101 receives as an input data to be set to the scan flip-flops SF101 to SF104. Data to be set to the scan flip-flops SF109 is input to the logic circuit LG102 via the selector SEL105.

Then, output data of the logic circuit LG101 in accordance with the testing input data is retrieved by the scan flip-clops SF105 to SF108 via the selectors SEL101 to SEL104. Output data of the logic circuit LG102 is retrieved by the scan flip-flop SF110.

On the other hand, when testing a memory, the memory unit MEM101 receives as an input a test pattern (write data DIN, address data ADR, a chip selection signal CS, and a read/write selection signal RW) generated by the testing circuit BT101 via the selectors SEL101 to SEL104. Then, a read data DOUT of the memory unit MEM101 in accordance with the test pattern is input to the testing circuit BT101 via the selector SEL105. In the testing circuit BT101, a test for detecting a defect in the memory unit MEM101 is conducted based on the input read data DOUT.

A test result S103 of the testing circuit BT101 in each memory test block (101 to 103) is retrieved by an external testing device of the semiconductor integrated circuit and used for analyzing detects of the memory unit, etc.

As explained above, in the semiconductor integrated circuit of the related art shown in FIG. 9, the testing circuit BT101 is provided for each memory test block (101 to 103), so that an increase of the circuit area due to the testing circuits BT101 becomes a problem.

Particularly, in recent years, defect modes of a memory have become diverse due to a semiconductor circuit becoming finer and requiring a lower voltage. Namely, there are a mode of causing a defect collectively by adjacent memory cells and a mode of causing defects separately by memory cells in a way of scattering to spots, etc. Therefore, it has become difficult to detect defects sufficiently by a simple test pattern.

As a result, the memory testing circuit incorporated in the semiconductor integrated circuit in the BIST method is demanded to generate a detailed test pattern capable of dealing with a variety of defect modes and to have a high testing ability to process a large number of test results obtained in accordance therewith.

Such a high-performance testing circuit requires a large number of circuit elements, so that when it is applied to the method of providing a testing circuit for each memory to be tested as explained above, there arises a disadvantage that the circuit area remarkably increases.

To suppress the increase of the circuit area by the testing circuits, for example, as shown in FIG. 10, a method of using a test circuit in common by a plurality of memory test blocks can be also considered.

The semiconductor integrated circuit shown in FIG. 10 has memory test blocks 104, 105 and 106.

The memory test blocks 104 to 106 are obtained by omitting the testing circuit BT101 from the memory test blocks 101 to 103 explained above.

A test of the memory unit MEM101 in the memory test blocks 104 to 106 is conducted by a common testing circuit BT102.

However, the method of sharing a testing circuit as shown in FIG. 10 has a disadvantage that the test speed declines due to a wiring delay between a memory and the testing circuit.

Namely, when the number of memories increases, a wiring length from a memory to the testing circuit becomes long and a parasitic capacitance of the wiring generates a signal delay, so that the test speed becomes slow. Therefore, the number of memories to share a testing circuit has to be limited to keep the decline of the testing speed within an allowance. Accordingly, when the number of memories is large or operation speeds of memories are high, a plurality of testing circuits has to be provided and an increase of the circuit area becomes a hurdle.

SUMMARY OF THE INVENTION

It is desired to provide a semiconductor integrated circuit for performing processing relating to a test of a plurality of memory units provided therein while suppressing an increase of the circuit area.

According to the present invention, there is provided a semiconductor integrated circuit including a plurality of memory units, a logic circuit connected to the plurality of memory units and a plurality of scan flip-flops for carrying out a scan test on the logic circuit, a first operation mode for carrying out a test on said memory units, and a second operation mode for accessing to said memory units from the logic circuit being defined; a first data shift circuit having a plurality of stages of registers corresponding to the plurality of memory units, for inputting testing input data to a register in a first stage among the plurality of stages and shifting the same to registers in the subsequent stages in the first operation mode, and a first selection circuit for selecting the testing input data, which were shifted and outputted from the respective registers in the corresponding stages in the first operation mode, and selecting data output from the logic circuit in the second operation mode, to determine the data input to the memory units, wherein the respective registers of said first data shift circuit being formed by the scan flip-flops.

In the second operation mode for accessing from the logic circuit to the memory units, output data of the logic circuit is input to the memory units via the first selection circuit. On the other hand, in the first operation mode for carrying out a test on the memory units, input test data for the memory units is shifted from the register on the first stage to registers in the subsequent stages successively in the first data shift circuit. The input test data to be shifted on the registers of the first data shift circuit is input respectively to the memory units corresponding to the registers. As a result, in the first operation mode, the input test data is shifted successively on the registers of the first data shift circuit formed by using the scan flip-flops and transferred to the plurality of memory units.

Preferably, a third operation mode for carrying out the scan test is furthermore defined. The first selection circuit selects output data of the logic circuit as data to be input to the memory units, in the third operation mode, and the semiconductor integrated circuit includes a second selection circuit for selecting the testing input data to be input from the first data shift circuit in the first operation mode and selecting data to be input from the first selection circuit to the respective memory units in the third operation mode to determine the data input to the memory units.

Preferably, the semiconductor integrated circuit further includes a second data shift circuit having a plurality of stages of registers corresponding to the plurality of memory units, for generating testing output data in accordance with data output from each of the memory units in response to the testing input data for each of the plurality of memory units, and for making the generated testing output data to be latched by corresponding registers and for shifting the latched testing output data to registers on subsequent stages; and the registers in the second data shift circuit are formed by using the scan flip-flops.

Preferably, the second data shift circuit includes a plurality of testing output data generation circuits corresponding to the plurality of stages of registers. The testing output data generation circuit corresponding to a register in the first stage of the second data shift circuit, in the first operation mode, generates testing output data having a first value and makes the same latched by the register when a data value output from a memory unit corresponding to the register in response to the testing input data does not match with an expected value, or generates testing output data having a second value and makes the same latched by the register when the output data of the memory unit matches with the expected value. The testing output data generation circuit corresponding to registers in the subsequent stages of the first stage of the second data shift circuit, in the first operation mode, generates testing output data having the first value and makes the same latched by the register when the data value output from a memory unit corresponding to the register in response to the testing input data does not match with the expected value or when the testing output data to be shifted from a previous stage of the register has the first value, or generates testing output data having the second value and makes the same latched by the register when a value of output data of the memory unit matches with the expected value and the testing output data to be shifted from the previous stage of the register has the second value.

Preferably, the semiconductor integrated circuit further includes a third data shift circuit having a plurality of stages of registers corresponding to the plurality of memory units, for shifting expected value data from a register on a first stage to registers on the subsequent stages successively in the first operation mode. The testing output data generation circuit corresponding to a register in each stage of the second data shift circuit uses a value of the expected value data to be shift-input to a register in a corresponding stage of the third data shift circuit as the expected value in the first operation mode.

Preferably, registers of the third data shift circuit are formed by the scan flip-flops.

Preferably, when a control signal instructing an invalidation of an output of a test result is input in the first operation mode, the testing output data generation circuit generates the testing output data on the assumption that a data value output from a corresponding memory unit in response to the testing input data has the expected value.

Preferably, the second data shift circuit includes a plurality of testing output data generation circuits corresponding to the plurality of stages of registers. The testing output data generation circuit corresponding to a register on a first stage of the second data shift circuit makes data output from a memory unit corresponding to the register in response to the testing input data or data corresponding thereto latched by the register as the testing output data when a control signal instructing a read of an output data of the memory unit is input in the first operation mode; and the testing output data generation circuit corresponding to registers in the subsequent stages of the first stage of the second data shift circuit makes data output from a memory unit corresponding to the register in response to the testing input data or data corresponding thereto latched by the register as the testing output data when a control signal instructing a read of an output data of the memory unit is input, while it makes the testing output data to be shifted from a previous stage of the register latched by the register when a control signal instructing an invalidation of the reading is input.

Preferably, the testing output data generation circuit corresponding to a register on a first stage of the second data shift circuit makes data output from a memory unit corresponding to the register in response to the testing input data or data corresponding thereto latched by the register as the testing output data when a control signal instructing a read of an output data of the memory unit is input in the first operation mode; and the testing output data generation circuit corresponding to registers in the subsequent stages of the first stage of the second data shift circuit makes data output from a memory unit corresponding to the register in response to the testing input data or data corresponding thereto latched by the register as the testing output data when a control signal instructing a read of an output data of the memory unit is input, while it makes the testing output data to be shifted from the previous stage of the register latched by the register when a control signal instructing an invalidation of the reading is input.

Preferably, the semiconductor integrated circuit further includes a testing input data generation circuit for generating the testing input data to be supplied to a first stage of the first data shift circuit in the first operation mode.

Preferably, the semiconductor integrated circuit further includes a testing input data generation circuit for generating the testing input data to be supplied from a first stage of the first data shift circuit in the first operation mode and a determination circuit for retrieving a testing output data output from a final stage of the second data shift circuit and determining whether the memory unit is good or bad based on the retrieved testing output data in the first operation mode.

According to the present invention, there is also provided a semiconductor integrated circuit including a plurality of memory units, a logic circuit connected to the plurality of memory units and a plurality of scan flip-flops for carrying out a scan test on the logic circuit, and having a data shift circuit having a plurality of stages of registers corresponding to the plurality of memory units, for generating testing output data in accordance with data output from the memory unit in response to the testing input data for each of the plurality of memory units, making the generated testing output data latched by a corresponding register and shifting the latched testing output data to registers in the subsequent stages successively in an operation mode for carrying out a test of the memory unit by inputting test data to the memory unit, wherein the respective registers of the data shift circuit are formed by using the scan flip-flops.

Preferably, the semiconductor integrated circuit further includes a determination circuit for retrieving data output from a final stage of the data shift circuit and determining whether the memory unit is good or bad based on the retrieved data in the operation mode.

BRIEF DESCRIPTION OF DRAWINGS

These and other objects and features of the present invention will become clearer from the following description of the preferred embodiments given with reference to the attached drawings, in which:

FIG. 3A to FIG. 3I are timing charts illustrating an example of a transfer operation of testing input data and testing output data in the semiconductor integrated circuit shown in FIG. 1;

FIG. 10 is a second view of the example of the semiconductor integrated circuit of the related art having a function of testing a memory unit.

DESCRIPTION OF THE PREFERRED EMBODIMENT

Below, embodiments of the present invention will be explained based on the drawings.

Figure 1:
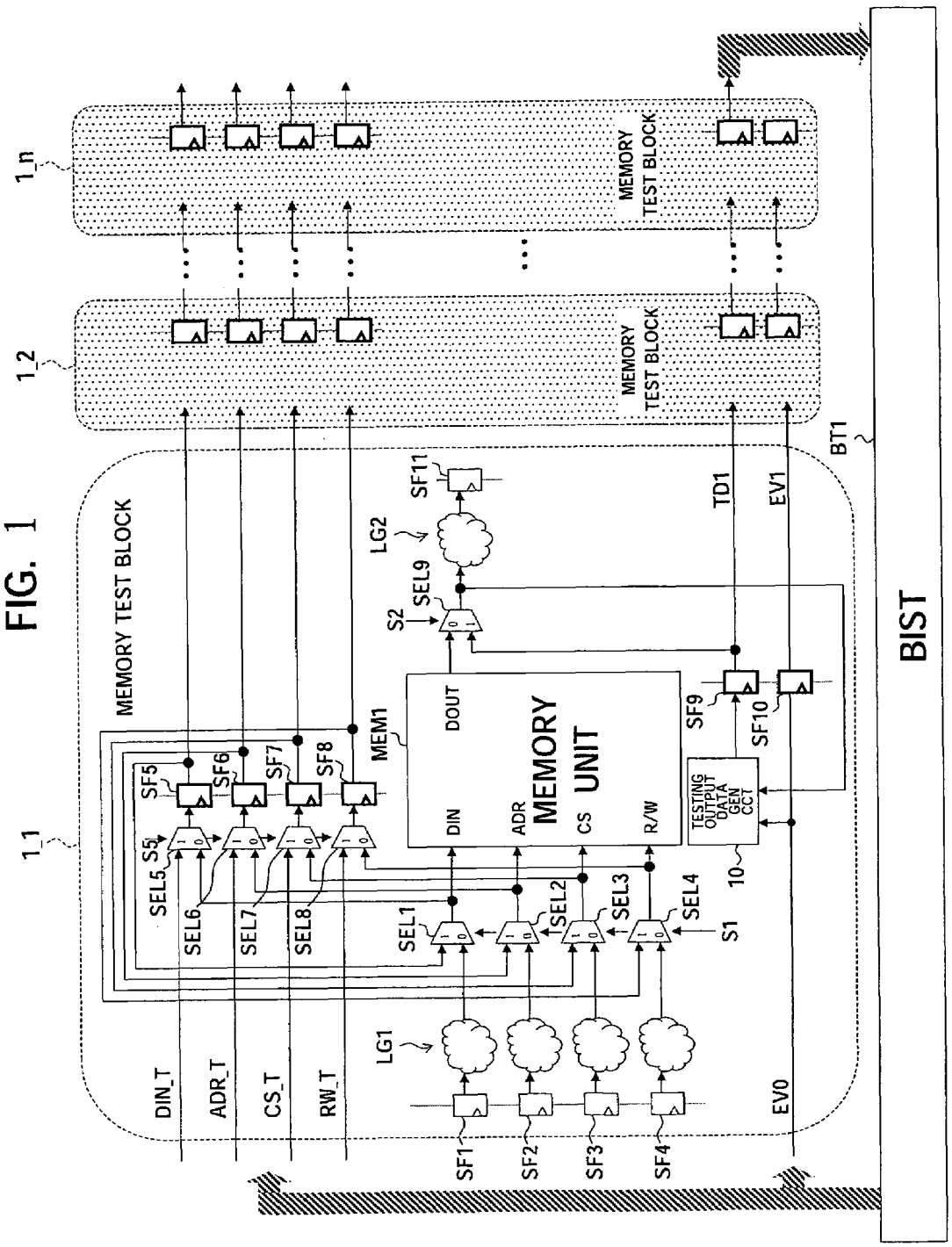
FIG. 1 is a view of an example of the configuration of a semiconductor integrated circuit according to an embodiment of the present invention.

FIG. 1 is a view of an example of the configuration of a semiconductor integrated circuit according to an embodiment of the present invention.

The semiconductor integrated circuit shown in FIG. 1 has memory test blocks 1_1, . . . , 1_n by the number of "n" (n is any integer larger than 1. It will be the same below.) as circuit blocks relating to a memory test.

Each of the memory test blocks 1_1, . . . , 1_n has a memory unit MEM1, logic circuits LG1 and LG2, scan flip-flops SF1, . . . , SF11, selectors SEL1, . . . , SEL9 and a testing output data generation circuit 10.

Also, the semiconductor integrated circuit shown in FIG. 1 has a test circuit BT1 for carrying out a test on the memory test blocks 1_1, . . . , 1_n.

Components of the semiconductor integrated circuit shown in FIG. 1 and those in the present invention have corresponding relationships as explained below.

The memory unit MEM1 is an embodiment of the memory unit of the present invention.

A circuit including the logic circuits LG1 and LG2 of each of the memory test blocks is an embodiment of the logic circuit of the present invention.

The scan flip-flops SF1 to SF11 are an embodiment of the scan flip-flops of the present invention.

Registers formed by the scan flip-flops SF5 to SF11 are an embodiment of the registers in the first data shift circuit of the present invention.

The circuit including the selectors SEL1 to SEL4 of each of the memory test blocks is an embodiment of the first selection circuit of the present invention.

The circuit including the selectors SEL5 to SEL8 of each of the memory test blocks is an embodiment of the second selection circuit of the present invention.

A register formed by the scan flip-flop SF9 is an embodiment of the register in the second data shift circuit of the present invention.

A register formed by the scan flip-flop SF10 is an embodiment of the register in the third data shift circuit of the present invention.

The testing output data generation circuit 10 is an embodiment of the testing output data generation circuit of the present invention.

The memory unit MEM1 is one of a plurality of memory units mounted together with the logic circuits on the semiconductor integrated circuit according to the present embodiment and includes a memory, such as an SRAM and DRAM.

The memory unit MEM1 shown in the example in FIG. 1 receives write data DIN, address data ADR, a chip selection signal CS and a read/write selection signal RW and outputs read data DOUT.

The memory unit MEM1 becomes accessible, for example, when a value of the chip selection signal CS is "1", performs a write operation when a value of the read/write selection signal RW is "1" and performs a read operation when the value is "0" at this time.

In the write operation, write data DIN is written in a memory area specified by address data ADR.

In the read operation, data stored in the memory area specified by address data ADR is output as read data DOUT.

The logic circuit LG1 is a circuit for generating data (DIN, ADR, CS and RW) to be input to the memory unit MEM1 and configured, for example, by a random logic.

The logic circuit LG2 is a circuit for performing processing by receiving as an input data read from the memory unit MEM1 and configured, for example, by a random logic.

Note that logic functions of the logic circuits LG1 and LG2 may be different or the same between the memory test blocks.

The scan flip-flops SF1 to SF11 configure a scan path circuit for carrying out a scan test together with other not shown scan flip-flops. Each of the scan flip-flops is connected to a logic circuit in the semiconductor integrated circuit, and the scan path circuit configures one (or a plurality of) shift register, wherein a plurality of the scan flip-flops are serially connected.

In an operation mode of carrying out a scan test (a third operation mode), test data is serially transferred from a testing device provided to the outside (or inside) of the semiconductor integrated circuit to the scan path circuit and set to the respective scan flip-flops. The test data set to the scan flip-flops is input to the logic circuits inside. Output data of the logic circuits in accordance with the test data is latched by the scan flip-flops and output from the scan path circuit to the test device of the outside (or inside) of the semiconductor integrated circuit by a serial transfer.

The scan flip-flops SF1 to SF4 test input data to the logic circuit LG1 at the time of a scan test.

The scan flip-flops SF5 to SF8 store data to be input to the memory unit MEM1 at the time of a scan test.

Namely, the scan flip-flop SF5 stores write data DIN input from the logic circuit LG1 via the selector SEL5.

The scan flip-flop SF6 stores address data ADR input from the logic circuit LG1 via the selector SEL2.

The scan flip-flop SF7 stores a chip selection signal CS input from the logic circuit LG1 via the selector SEL3.

The scan flip-flop SF8 stores a read/write selection signal RW input from the logic circuit LG1 via the selector SEL4.

Accordingly, in the third operation mode of carrying out a scan test, test data is input to the logic circuit LG1 from the scan flip-flops SF1 to SF4, and output data of the logic circuit LG1 in accordance therewith is retrieved by the scan flip-flops SF5 to SF8. By analyzing the retrieved output data by the external or internal test device, a malfunction of the logic circuit LG1 can be detected.

Furthermore, the scan flip-flops SF5 to SF8 form registers for storing testing input data (DIN_T, ADR_T, CS_T and RW_T) to be supplied to the memory unit MEM1 in the operation mode of carrying out a test on the memory unit MEM1 (a first operation mode).

The registers (SF5 to SF8) included in each of the memory test blocks are serially connected in the order of the memory test blocks 1_1, . . . , 1_n and form one data shift circuit (first data shift circuit).

The first data shift circuit has a function of shifting testing input data supplied from the testing circuit BT1 from a register on the first stage (that is, a register of the memory test block 1_1) to registers on subsequent stages in the first operation mode of carrying out a test on the memory unit MEM1.

The scan flip-flop SF9 replaces read data of the memory unit MEM1 and stores data to be input to the logic circuit LG2 in the third operation mode of carrying out a scan test. Namely, data to be set to the scan flip-flop SF9 at the time of a scan test is input to the logic circuit LG2 via the selector SEL9.

The scan flip-flop SF11 stores data output from the logic circuit LG2 in the third operation mode of carrying out a scan test.

Accordingly, in the third operation mode of carrying out a scan test, test data is input to the logic circuit LG2 from the scan flip-flop SF9 via the selector SEL9, and output data of the logic circuit LG2 in accordance therewith is retrieved by the scan flip-flop SF11. By analyzing the output data, a malfunction of the logic circuit LG2 can be detected.

Also, the scan flip-flop SF9 forms a register for storing testing output data output from the testing output data generation circuit 10 in the operation mode of carrying out a test on the memory units MEM1 (the first operation mode). The testing output data is data in accordance with the read data DOUT output from the memory unit MEM1 in response to the testing input data (DIN_T, ADR_T, CS_T and RW_T), as will be explained later on.

The register (SF9) included in each of the memory test blocks is serially connected in the order of the memory test blocks 1_1, . . . , 1_n and forms one data shift circuit (a second data shift circuit).

The second data shift circuit has a function of shifting the testing output data from a register on the first stage (that is, a register of the memory test block 1_1) to registers on subsequent stages successively in the first operation mode of carrying out a test on the memory unit MEM1.

The scan flip-flop SF10 forms a register for storing expected value data in the first operation mode of carrying out a test on the memory unit MEM1. The expected value data is used for determining whether the read data DOUT of the memory unit MEM1 has an expected value in accordance with the testing input data in a later explained testing output data generation circuit 10 and generated in the testing circuit BT1.

The register (SF10) included in each of the memory test blocks is serially connected in the order of the memory test blocks 1_1, ..., 1_n and forms one data shift circuit (a third data shift circuit).

The third data shift circuit has a function of shifting the above expected value data from a register on the first stage (that is, a register of the memory test block 1_1) to registers on subsequent stages successively in the first operation mode of carrying out a test on the memory unit MEM1.

The selectors SEL1 to SEL4 perform a signal selection operation, as explained below, by following a control signal S1 supplied from a not shown control circuit.

Namely, the selector SEL1 selects write data DIN output from the logic circuit LG1 and inputs the data to the memory unit MEM1 in a normal operation mode of accessing to the memory unit MEM1 from the logic circuits LG1 and LG2 (a second operation mode), while it selects testing input data DIN_T shifted to the scan flip-flop SF5 and inputs the data to the memory unit MEM1 in the first operation mode of carrying out a test on the memory unit MEM1.

In the same way, the selector SEL2 selects address data ADR output from the logic circuit LG1 and inputs the data to the memory unit MEM1 in the second operation mode, while it selects testing input data SDR_T shifted to the scan flip-flop SF6 and inputs the data to the memory unit MEM1 in the first operation mode.

The selector SEL3 selects a chip selection signal CS output from the logic circuit LG1 and inputs the signal to the memory unit MEM1 in the second operation mode, while selects testing input data CS_T shifted to the scan flip-flop SF7 and inputs the data to the memory unit MEM1 in the first operation mode.

The selector SEL4 selects a read/write selection signal RW output from the logic circuit LG1 and inputs the data to the memory unit MEM1 in the second operation mode, while it selects testing input data CS_T shifted to the scan flip-flop SF8 and inputs the data to the memory unit MEM1 in the first operation mode.

The selectors SEL5 to SEL8 perform a signal selection operation as explained below, by following a control signal S5 supplied from a not shown control circuit.

Namely, the selector SEL5 selects write data DIN input from the selector SEL1 to the memory unit MEM1 and inputs the data to the scan flip-flop SF5 in the third operation mode of carrying out a scan test, while it selects testing input data DIN_T (in the case of the selector SEL5 of the memory test block 1_1, testing input data DIN_T supplied from the testing circuit BT1) output from a register on the previous stage of the first data shift circuit and inputs the data to the scan flip-flop SF5 in the first operation mode of carrying out a test on the memory unit MEM1.

In the same way, the selector SEL6 selects address data ADR input from the selector SEL2 to the memory unit MEM1 and inputs the data to the scan flip-flop SF6 in the third operation mode, while it selects testing input data ADR_T (in the case of the selector SEL6 of the memory test block 1_1, testing input data ADR_T supplied from the testing circuit BT1) output from a register of the previous stage of the first data shift circuit and inputs the data to the scan flip-flop SF6 in the first operation mode.

The selector SEL7 selects a chip selection signal CS input from the selector SEL3 to the memory unit MEM1 and inputs the signal to the scan flip-flop SF7 in the third operation mode, while it selects testing input-data CS_T (in the case of the selector SEL7 of the memory test block 1_1, testing input data CS_T supplied from the testing circuit BT1) output from a register on the previous stage of the first data shift circuit and inputs the data to the scan flip-flop SF7 in the first operation mode.

The selector SEL8 selects a read/write selection signal RW input from the selector SEL4 to the memory unit MEM1 and inputs the signal to the scan flip-flop SF8 in the third operation mode, while it selects testing input data RW_T (in the case of the selector SEL8 of the memory test block 1_1, testing input data RW_T supplied from the testing circuit BT1) output from a register on the previous stage of the first data shift circuit and inputs the data to the scan flip-flop SF8 in the first operation mode.

The selector SEL9 performs a signal selection operation, as explained below, by following a control signal S2 supplied from a not shown control circuit.

In the first operation mode of carrying out a test on the memory unit MEM1 and in the second operation mode of accessing to the memory unit MEM1 from the logic circuits LG1 and LG2, read data DOUT output from the memory unit MEM1 is selected and input to the logic circuit LG2. In the third operation mode of carrying out a scan test, input data for a scan test to be stored in the scan flip-flop SF9 is selected and input to the logic circuit LG2.

The testing output data generation circuit 10 generates testing output data in accordance with read data DOUT output from the memory unit MEM1 in response to the testing input data (DIN_T, ADR_T, CS_T and RW_T) stored in the registers (SF5 to SF8) of the first data shift circuit in the first operation mode of carrying out a test on the memory unit MEM1. Then, the generated testing output data is input to the register (SF9) of the second data shift circuit and latched thereby.

For example, the testing output data generation circuit 10 generates three kinds of testing output data (first to third testing output data) in accordance with a control signal given by a not shown control circuit.

The first testing output data is for detecting whether a memory unit, which outputs read data DOUT not matched with expected value data, is included in the memory units by the number of "n" to be tested.

When generating the first testing output data, the testing output data generation circuit 10 of each of the memory test blocks operates, for example, as below.

The testing output data generation circuit 10 belonging to the memory test block 1_1 (that is, the testing output data generation circuit 10 corresponding to a register on the first stage of the second data shift circuit) compares read data DOUT output from the memory unit MEM1 belonging to the memory test block 1_1 in response to testing input data with expected value data input to the register (SF10) of the third data shift circuit belonging to the memory test block 1_1. When both are identical, testing output data having a value of "0" is generated, while when both are not matched, testing output data having a value of "1" is generated and latched by the register (SF9) of the second data shift circuit belonging to the memory test block 1_1.

The testing output data generation circuit 10 belonging to the memory test block 1_i (i is an integer from 2 to n. It will be the same below.) (that is, the testing output data generation circuit 10 corresponding to a register on a subsequent stage of the second data shift circuit) compares the read data DOUT output from the memory unit MEM1 belonging to the memory test block 1_$i$ in response to the testing input data with expected value data shifted from a register on the previous stage of the register (SF10) of the third data shift circuit belonging to the memory test block 1_$i$. Then, when both are identical and the testing output data shifted from a register (SF9) on the previous stage of the second data shift circuit has a value of "0", testing output data having a value of "0" is generated and latched by the register (SF9) of the second data shift circuit belonging to the memory test block 1_$i$. When both are not matched or the value of the testing output data shifted from the register (SF9) of the second data shift circuit has a value "1" in the above comparison result, testing output data having a value of "1" is generated and latched by the register (SF9) of the second data shift circuit belonging to the memory test block 1_$i$.

As a result, a value of the testing output data shifted to a register on the final stage (the scan flip-flop SF9 belonging to the memory test block 1_$n$) of the second data shift circuit becomes "1" when the memory units by the number of "n" include a memory unit, which outputs read data DOUT not matched with the expected value data, while the value becomes "0" when all of the read data DOUT of the memory units by the number of "n" match with the expected value data.

The second testing output data is for detecting whether the read data DOUT output from a selected specific memory unit among the memory units by the number of "n" to be tested matches with the expected value data.

When generating the second testing output data, the testing output data generation circuit 10 of each of the memory test blocks operates, for example, as explained below.

The testing output data generation circuit 10 belonging to the same memory test block 1_$j$ ("j" is any integer from 1 to n. It will be the same below.) as the specific memory unit MEM1 generates data having the same value as that of the first testing output data explained above.

The testing output data generation circuit 10 belonging to memory test blocks other than the memory test block 1_$j$ invalidates an output of the result of comparison with the expected value data. Namely, a data having the same value as that of the first testing output data is generated on an assumption that the read data DOUT of the memory unit MEM1 always matches with the expected value data.

As a result, the testing output data shifted to a register on the final stage (the scan flip-flop SF9 belonging to the memory test block 1_$n$) of the second data shift circuit becomes equal to testing output data generated in the testing output data generation circuit 10 belonging to the memory test block 1_$j$. Namely, the value becomes "0" when the read data DOUT of the specific memory unit MEM1 matches with the expected value data, while it becomes "1" when not matched.

The third testing output data is for checking the read data DOUT output from the selected specific memory unit among the memory units by the number of "n" to be tested.

When generating the third testing output data, the testing output data generation circuit 10 of each of the memory test blocks operates, for example, as explained below.

When a memory unit MEM1 belonging to the memory test block 1_1 is selected by a specific memory unit, the testing output data generation circuit 10 belonging to the memory test block 1_1 (that is, the testing output data generation circuit 10 corresponding to a register on the first stage of the second data shift circuit) uses read data DOUT output from the memory unit MEM1 in response to the testing input data as the third testing output data to be latched by the register (SF9) of the second data shift circuit belonging to the memory test block 1_1.

When a memory unit MEM1 belonging to the memory test block 1_1 is selected by a specific memory unit, the testing output data generation circuit 10 belonging to the memory test block 1_$i$ (that is, the testing output data generation circuit 10 corresponding to a register on a subsequent stage of the second data shift circuit) uses read data DOUT output from the memory unit MEM1 in response to the testing input data as the third testing output data to be latched by the register (SF9) of the second data shift circuit belonging to the same memory test block. When the memory unit MEM1 belonging to the same memory test block is not selected as the specific memory unit, a third testing output data shifted from a register (SF9) on the previous stage of the second data shift circuit is latched by the register (SF9) of the second data shift circuit belonging to the same memory test block.

As a result, the third testing output data shifted to a register on the final stage (the scan flip-flop SF9 belonging to the memory test block 1_$n$) of the second data shift circuit becomes equal to the read data DOUT output from the specific memory unit MEM1.

Figure 2:
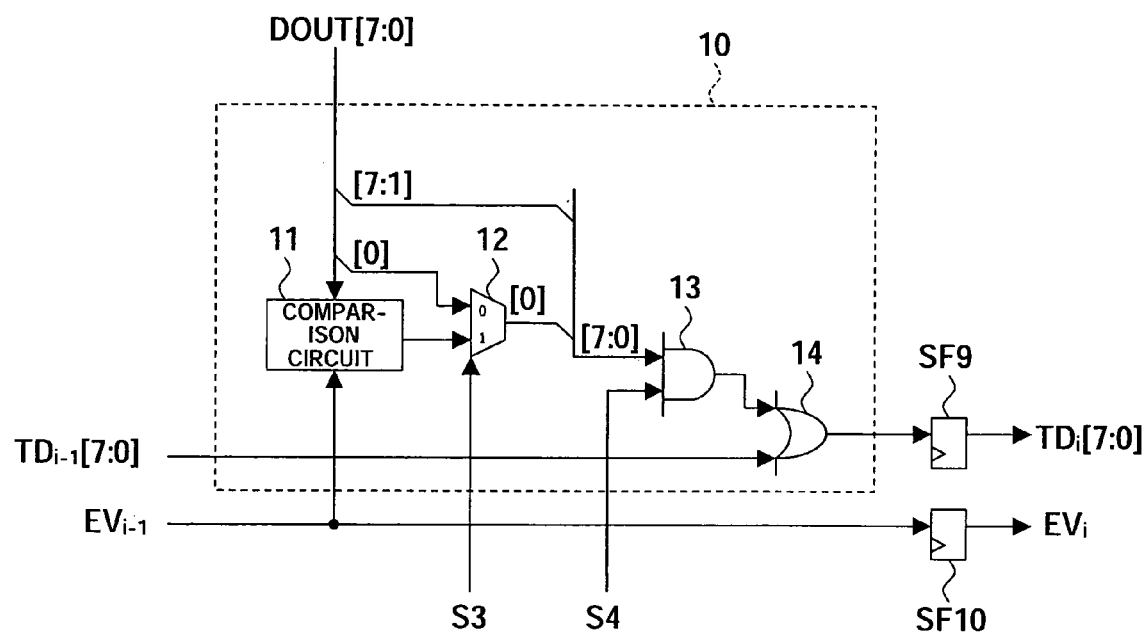
FIG. 2 is a view of an example of the configuration of a testing output data generation circuit.

FIG. 2 is a view of an example of the configuration of the testing output data generation circuit 10 belonging to the memory test block 1_$i$. In the example in FIG. 2, the read data DOUT of the memory unit MEM1 is 8 bits.

The testing output data generation circuit 10 shown in FIG. 2 includes a comparison circuit 11, a selector 12, an AND circuit and an OR circuit 14.

The comparison circuit 11 compares expected value data $EV_{i-1}$ output from a register on the previous stage (the scan flip-flop SF10 belonging to the memory test block 1_(i−1)) in the third data shift circuit with read data DOUT output from the memory unit MEM1 belonging to the same memory test block 1_$i$ and outputs a determination signal having a value of "0" when both are identical, while it outputs "1" when both are not matched.

The selector 12 selects one of the determination signal output from the comparison circuit 11 and a signal of the least significant bit (the 0th bit) of the read data DOUT based on an input control signal S3 and outputs the same.

When generating the first testing output data or the second testing output data, the determination signal of the comparison circuit 11 is selected by the selector 12. When generating the third testing output data, the least significant bit of the read data DOUT is selected by the selector 12.

The AND circuit 13 calculates higher-order 7-bit data, excepting the least significant bit of the read data DOUT, and an AND (logical product) of 8-bit data composed of one-bit signal output from the selector and a one-bit control signal S4 to be input, respectively, and outputs 8-bit data as the calculation results.

The OR circuit 14 calculates an OR (logical sum) of the 8-bit data output from the AND circuit 13 and 8-bit testing output data $TD_{i-1}$ output from a register on the previous stage (the scan flip-flop SF9 belonging to the memory test block 1_(i−1)) in the second data shift circuit and outputs as testing output data $TD_i$ 8-bit data as the calculation result.

Note that, in the testing output data generation circuit 10 belonging to the memory test block 1_1, the OR circuit 14 in the configuration shown in FIG. 2 may be omitted because testing output data from a register on the previous stage does not exist. Namely, the output of the AND circuit 13 may be output as it is as the testing output data $TD_1$.

Alternately, the configuration may be the same as that of the testing output data generation circuit 10 shown in FIG. 2, and data, wherein the values of all bits are "0", may be input as the testing output data from the register on the previous stage.

The above-description is an explanation of the testing output data generation circuit.

The testing circuit BT1 generates testing input data (DI-ON_T, ADR_T, CS_T and RW_T) to be supplied to the registers on the first stage (the scan flip-flops SF5 to SF8 of the memory test block 1_1) of the first data shift register in the first operation mode of carrying out a test on memory units.

Also, in the first operation mode, the testing circuit BT1 retrieves testing output data output from the final stage (the scan flip-flop SF9 of the memory test block 1_n) of the second data shift circuit and determines whether each memory unit is good or bad based on the retrieved testing output data.

Here, an operation of the semiconductor integrated circuit having the above configuration will be explained for each operation mode.

[Second Operation Mode (Operation Mode of Accessing to Memory Unit MEM1 from Logic Circuits LG1 and LG2)]

In the second operation mode, the selectors SELL to SEL4 select write data DIN, address data ADR, a chip selection signal CS and a read/write selection signal RW output from the logic circuit LG1 and input to the memory unit MEM1.

Also, the selector SEL9 selects read data DOUT output from the memory unit MEM1 and inputs the data to the logic circuit LG2.

As a result, a normal access is made to the memory unit MEM1 by the logic circuits LG1 and LG2.

[Third Operation Mode (Operation Mode of Carrying Out Scan Test)]

In the third operation mode, the selectors SELL to SEL4 select write data DIN, address data ADR, a chip selection signal CS and a read/write selection signal RW output from the logic circuit LG1 and input to the memory unit MEM1.

On the other hand, the selector SEL9 selects input data for a scan test set to the scan flip-flop SF9 and inputs the data to the logic circuit LG2.

Test data to be supplied from the testing device provided to the outside (or inside) of the semiconductor integrated circuit is serially transferred to the scan path circuit and set to respective scan flip-flops. As a result, data input to the logic circuit LG1 is set to the scan flip-flops SF1 to SF4, and data input to the logic circuit LG2 is set to the scan flip-flop SF9.

Output data of the logic circuit LG1 in accordance with the input data to be set to the scan flip-flops SF1 to SF4 is input to the scan flip-flops SF5 to SF8 via the selectors SEL5 to SEL8 and latched by them. Also, output data of the logic circuit LG2 in accordance with the input data to be set to the scan flip-flop SF9 is input to the scan flip-flop SF11 via the selector SEL9 and latched thereby.

The output data of the logic circuits latched by the respective scan flip-flops is serially transferred through the scan path circuit and retrieved by the testing device provided to the outside (or inside) of the semiconductor integrated circuit. In the testing device, the data retrieved from the scan path circuit is analyzed and whether there is a defect in the logic circuits (LG1 and LG2, etc.) in the semiconductor integrated circuit is checked.

[First Operation Mode (Operation Mode of Carrying Out Test on Memory Unit)]

In the first operation mode, the selectors SEL5 to SEL8 select testing input data (DIN_T, ADR_T, CS_T and RW_T) to be shifted from the registers (SF5 to SF8) on the previous stage of the first data shift circuit and input the data to the registers (SF5 to SF8) on the subsequent stage.

Also, the selectors SELL to SEL4 select testing input data (DIN_T, ADR_T, CS_T and RW_T) to be stored in the registers (SF5 to SF8) of the first data shift circuit and input the data to the memory unit MEM1.

Furthermore, the selector SEL9 selects read data DOUT output from the memory unit MEM1 and inputs to the testing output data generation circuit 10.

FIG. 3A to FIG. 3I are timing charts illustrating an example of a data shift operation in the first data shift circuit and the second data shift circuit.

The testing circuit BT1 generates testing input data IN0, IN1, . . . successively (FIG. 3B), for example, in synchronization with a not shown clock signal CK (FIG. 3A) in the semiconductor integrated circuit. The first data shift circuit shifts the testing input data supplied from the testing circuit BT1 from a register on the first stage to registers on the subsequent stages successively (FIG. 3C to FIG. 3E) in synchronization with the clock signal CK. As a result, the testing input data IN0, IN1, . . . is successively input to the respective memory units MEM1 of the memory test blocks 1_1 to 1_3.

When read data DOUT is output from the memory unit MEM1 in response to the testing input data IN0, IN1, . . . , the testing output data generation circuit 10 of each of the memory test blocks generates testing output data OUT0, OUT1, . . . successively in accordance with the read data DOUT. The second data shift circuit shifts the generated testing output data from a register on the first stage to registers on subsequent stages successively (FIG. 3F to FIG. 3H) in synchronization with the clock signal CK. Then, the testing output data output from a register on the final stage (the scan flip-flop SF9 of the memory test block 1_3 in the example in FIG. 2) is retrieved by the testing circuit BT1 successively (FIG. 3I) in synchronization with the clock signal CK.

The testing output data generation circuit 10 of each of the memory test blocks generates any one of three kinds of testing output data (first to third testing output data) by following control signals S3 and S4 input from a not shown control circuit.

When generating the first testing output data, the selector 12 of each testing output data generation circuit 10 is controlled by the control signal S3 so as to select and output a determination signal of the comparison circuit 11. Also, the control signal S4 of each testing output data generation circuit 10 is set to have a value of "1".

As a result, in the most significant bit (the seventh bit) of the register (SF9) of the second data shift circuit, an OR of the determination signal output from the comparison circuit 11 and the most significant bit of the testing output data output from a register on the previous stage is input, and the OR is output as the most significant bit of the testing output data to the subsequent stage. Accordingly, the most significant bit of the testing output data output from a register on the final stage (the scan flip-flop SF9 of the memory test block 1_n) of the second data shift circuit becomes equal to a total OR of the determination signal output from the comparison circuit 11 in each testing output data generation circuit 10.

Also, as is known from the timing charts in FIG. 3A to FIG. 3I, the testing output data output from a register on the previous stage and read data DOUT of the memory unit MEM1 to be compared and determined in the comparison circuit 11 are generated in accordance with the same testing input data.

Accordingly, the most significant bit of the first testing output data output from a register on the final stage of the second data shift circuit to the testing circuit BT1 becomes equal to the total OR of the determination signal output from the comparison circuit 11 of each testing output data generation circuit 10 in response to the same testing input data.

As a result, when all of the read data DOUT of the memory units MEM1 by the number of "n" in response to the same testing input data match with the expected value data, the most significant bit of the testing output data output from the final stage of the second data shift circuit becomes "0". Also, when the memory units MEM1 by the number of "n" include a memory unit that outputs read data DOUT not matched with the expected value data, the most significant bit of the testing output data output from the final stage of the second data shift circuit becomes "1".

On the other hand, when generating the second testing output data, the selector 12 of each of the testing output data generation circuits 10 is controlled by the control signal S3 so as to select the determination signal of the comparison circuit 11. Also, a value of the control signal S4 of the testing output data generation circuit 10 belonging to a selected specific memory test block among the memory test blocks by the number of "n" is set to "1", and a value of the control signal S4 of the testing output data generation circuit 10 belonging to the remaining memory test blocks is set to "0".

As a result, in the testing output data generation circuits 10 belonging to other memory test blocks, except for the specific memory test block, all bits of the output signal of the AND circuit 14 become "0". Therefore, the register (SF9) of the second data shift circuit belonging to the memory test block latches the testing output data to be shifted from a register on the previous stage as it is.

As a result, the most significant bit of the first testing output data output from the final stage of the second data shift circuit becomes equal to the determination signal of the comparison circuit 11 in the specific memory test block. Namely, the most significant bit becomes "0" when the read data DOUT of the memory unit MEM1 belonging to the specific memory test block matches with the expected value data, while it becomes "1" when not matched.

When generating the third testing output data, the selector 12 of each testing output data generation circuits 10 is controlled by the control signal S3 so as to select the most significant bit (the seventh bit) of the read data DOUT. Also, a value of the control signal S4 of the testing output data generation circuit 10 belonging to a selected specific memory test block among the memory test blocks by the number of "n" is set to "1", and a value of the control signal S4 of the testing output data generation circuits 10 belonging to the remaining memory test blocks is set to "0".

As a result, in the testing output data generation circuits 10 belonging to other memory test blocks, except for the specific memory test block, all bits of the output signal of the AND circuit 14 become "0". Therefore, the register (SF9) of the second data shift circuit belonging to each of the memory test blocks latches the testing output data to be shifted from a register on the previous stage as it is.

As a result, the first testing output data output from the register on the final stage of the second data shift circuit becomes equal to the read data DOUT of the memory unit MEM1 in the specific memory test block.

Figure 9:
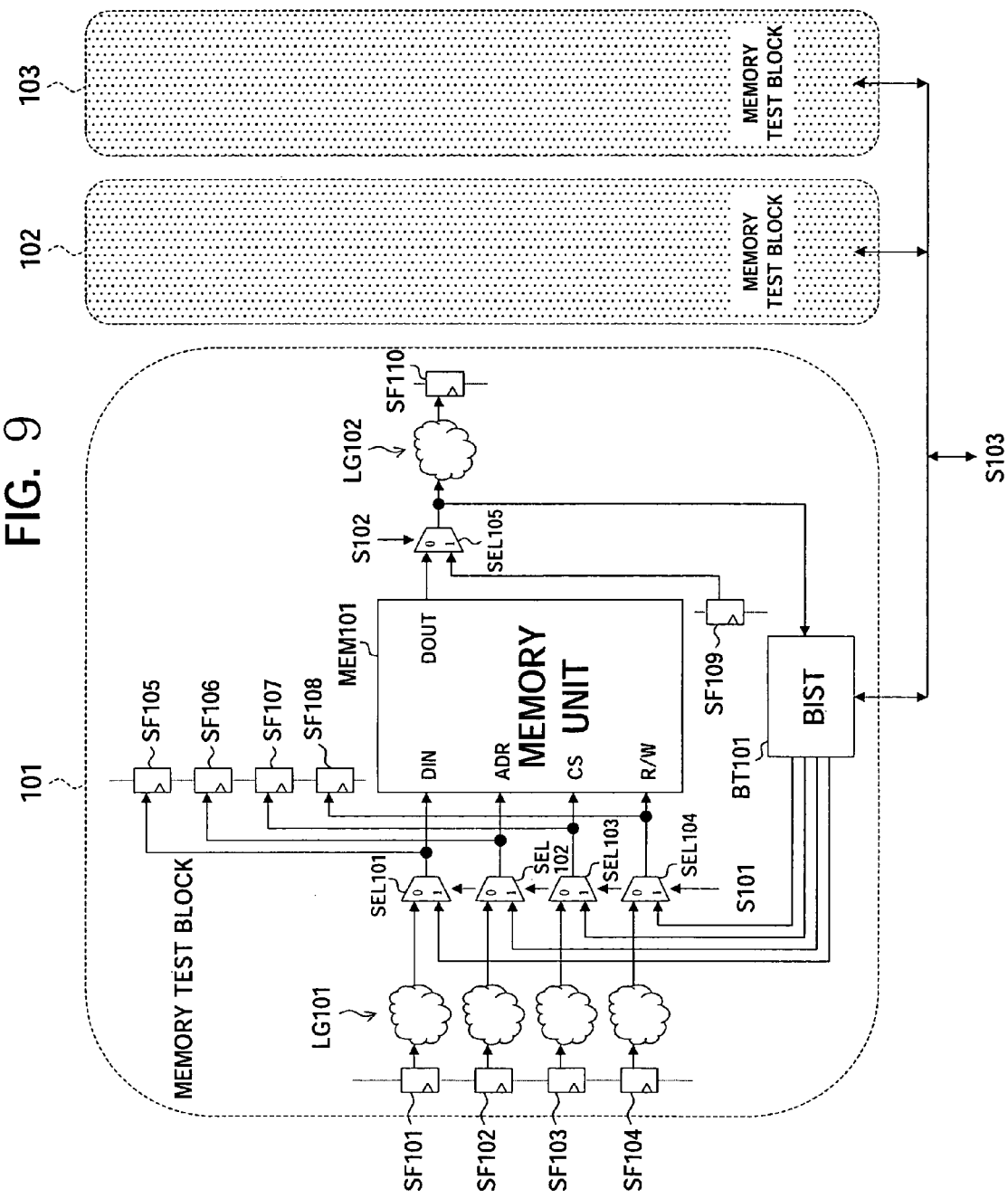
FIG. 9 is a first view of an example of a semiconductor integrated circuit of the related art having a function of testing a memory unit.

As explained above, according to the semiconductor integrated circuit according to the present embodiment, when testing a plurality of memory units MEM1, testing input data generated in the testing circuit BT1 is shifted successively on registers (SF5 to SF8) of the first data shift circuit formed by using scan flip-flops and transferred to the respective memory units. Then, testing output data in response to the testing input data is shifted successively on the registers (SF9) of the second data shift circuit formed by sing scan flip-flops and retrieved by the testing circuit BT1. Therefore, when comparing with the method of providing a testing circuit for each memory unit to be tested as shown in FIG. 9, an increase of the circuit scale can be suppressed.

Also, all of the registers (SF5 to SF8) of the first data shift circuit for supplying testing input data to the memory units MEM1 and the register (SF9) of the second data shift circuit for retrieving testing output data of the memory units MEM1 can be arranged close to the respective memory units MEM1 by effectively using scan flip-flops. Therefore, comparing with the case where a plurality of memory units and a testing circuit used in common have to be connected by long wiring as shown in FIG. 10, a signal delay due to wiring can be made short and the test speed can be made high.

Furthermore, according to the semiconductor integrated circuit according to the present embodiment, it becomes possible to test a plurality of memory units at a high speed by a testing circuit used in common, so that it is possible to apply a circuit with a high test performance and capable of dealing with a variety of defective modes as the testing circuit BT1. As a result, the reliability of the semiconductor integrated circuit can be improved.

The embodiment of the present invention was explained in detail above, but the present invention is not limited to the above embodiment and includes a variety of modifications.

Figure 4:
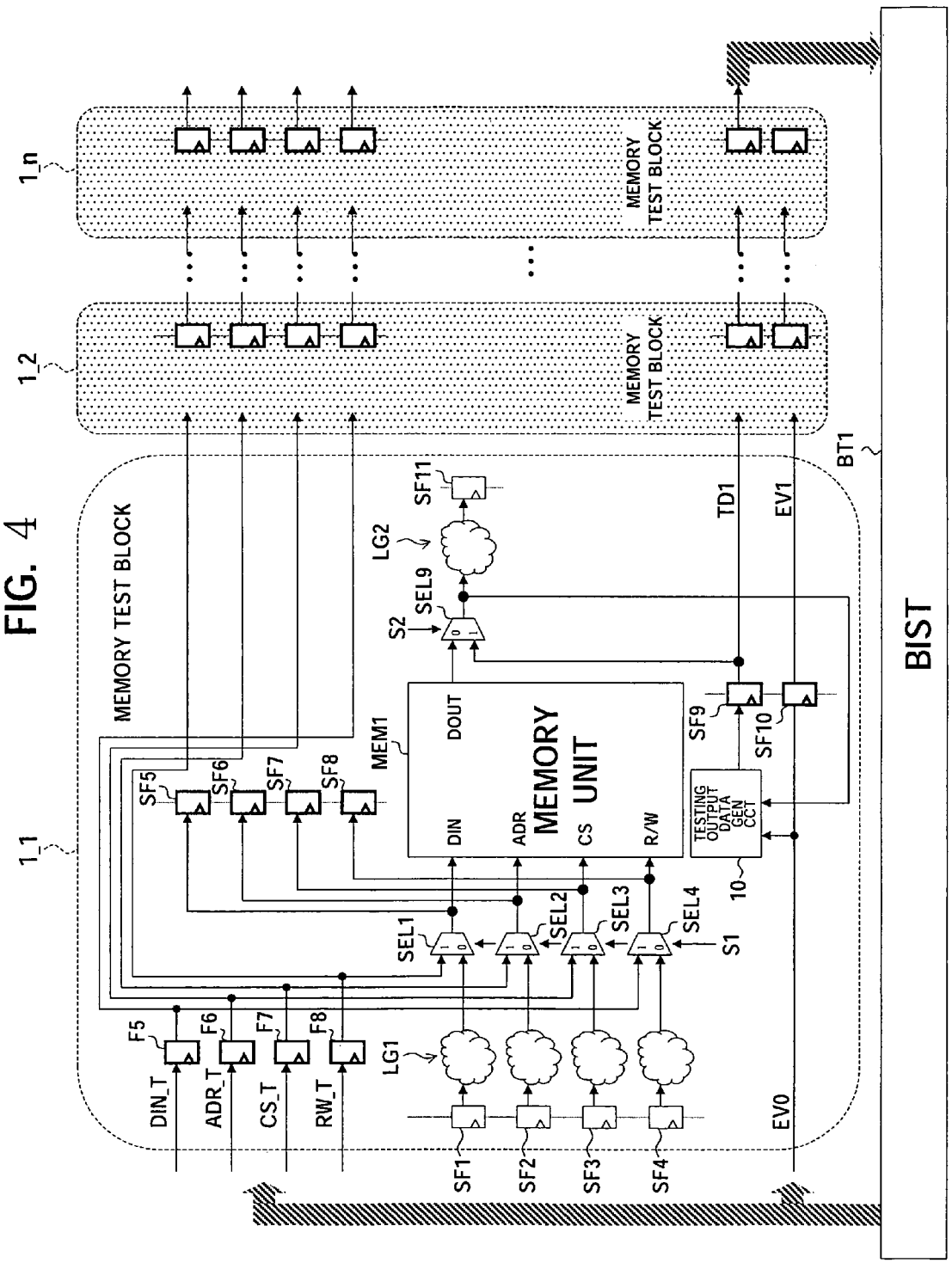
FIG. 4 is a view of a first modified example of a semiconductor integrated circuit according to an embodiment of the present invention.

In the example in FIG. 1, scan flip-flops are used as the registers for transferring testing input data, but they can be replaced by normal flip-flops, as shown in FIG. 4.

The semiconductor integrated circuit shown in FIG. 4 is obtained by omitting the selectors SEL5 to SEL8 in each of the respective memory test blocks and adding flip-flops F5 to F8 instead in the semiconductor integrated circuit shown in FIG. 1.

The selectors SEL5 to SEL8 correspond to registers on the first stage in the first data shift circuit explained above and serially connected in an order of the memory test blocks 1_1 to 1_n. Then, testing input data (DIN_T, ADR_T, CS_T and RW_T) from the testing circuit BT1 is input to the registers (flip-flops F5 to F8 of the memory test block 1_1) of the data shift circuit, and testing output data is output from the registers on the final stage (the flip-flops F5 to F8 of the memory test block 1_n) to the testing circuit BT1.

The semiconductor integrated circuit shown in FIG. 4 also gives the effect of suppressing an increase of the circuit scale because the scan flip-flops are effectively used in transferring the testing output data.

Figure 5:
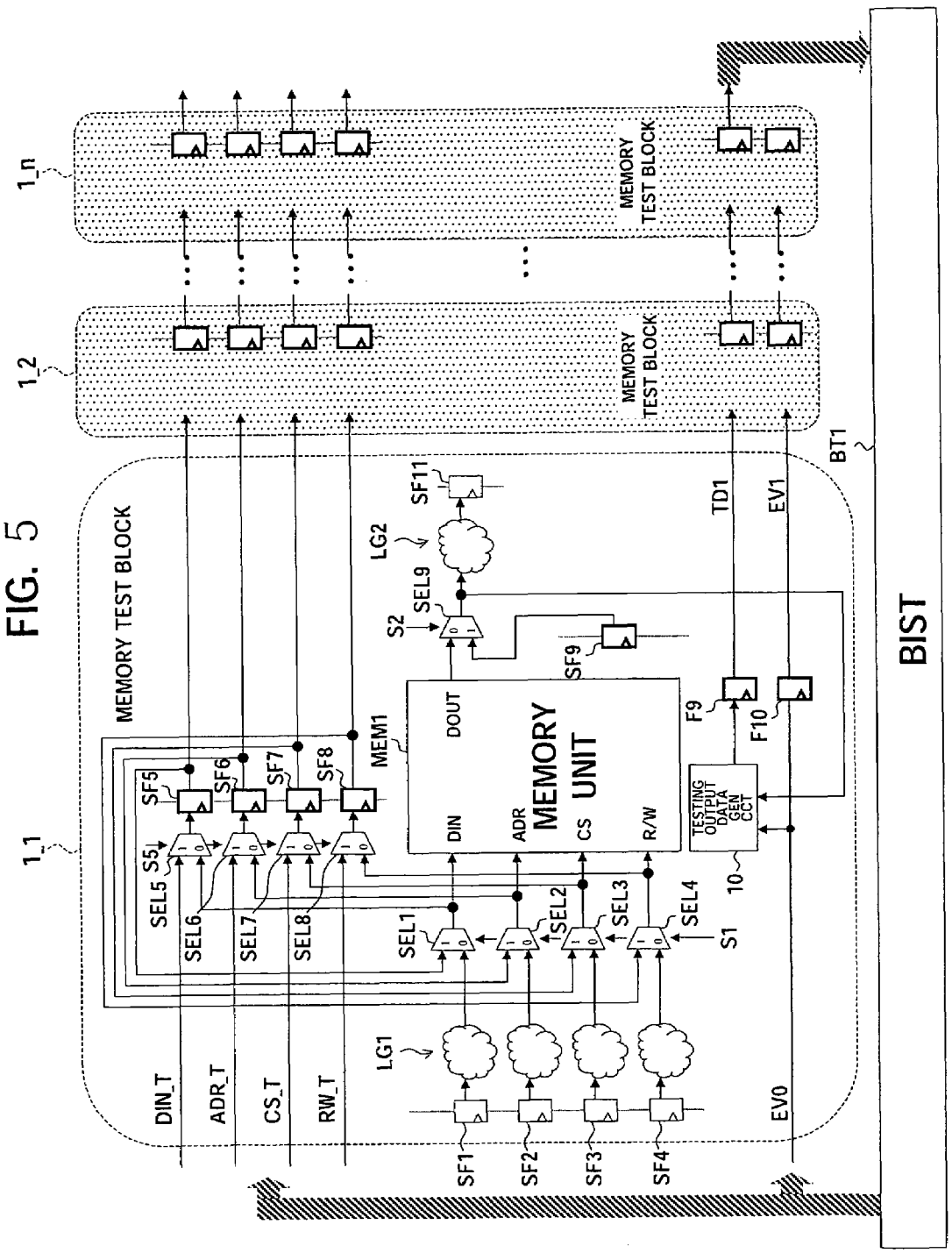
FIG. 5 is a view of a second modified example of a semiconductor integrated circuit according to an embodiment of the present invention.

Also, in the example in FIG. 1, scan flip-flops are used as the registers for transferring testing output data, but they may be replaced by normal flip-flops as shown in FIG. 5.

The semiconductor integrated circuit in FIG. 5 is obtained by adding flip-flops F9 and F10 to each of the memory test blocks in the semiconductor integrated circuit shown in FIG. 1.

The flip-flop F9 is to replace the scan flip-flop SF9 in the semiconductor integrated circuit shown in FIG. 1 and corresponds to the register on the first stage in the second data shift circuit explained above. Also, the flip-flop F10 is to replace the scan flip-flop SF10 in the semiconductor integrated circuit in FIG. 1 and corresponds to the register on the first stage in the third data shift circuit explained above.

The semiconductor integrated circuit shown in FIG. 5 also gives the effect of suppressing an increase of the circuit scale because the scan flip-flops are effectively used in transferring the testing output data.

Furthermore, in the above embodiment, an example of generating three kinds of testing output data in the testing output data generation circuit 10 is explained, but the present invention is not limited to this. For example, it may be configured to generate a part of the three kinds.

Figure 6:
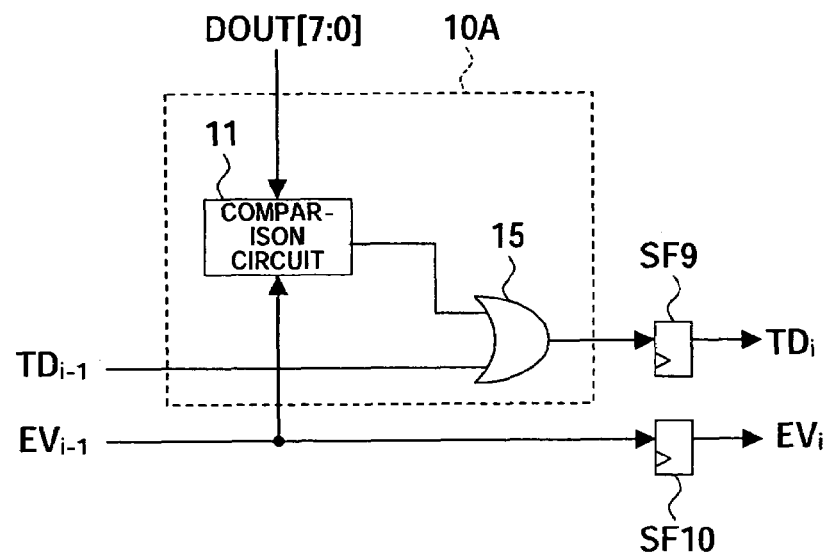
FIG. 6 is a view of a first modified example of a testing output data generation circuit.

The testing output data generation circuit 10 shown in FIG. 6 is an example of the configuration of generating only the first output data.

The testing output data generation circuit 10A is obtained by omitting the selector 12, the AND circuit 13 and the OR circuit 14 in the testing output data generation circuit 10 shown in FIG. 2 and providing an OR circuit 15 instead.

The OR circuit 15 calculates an OR of one-bit testing output data $TD_{i-1}$ output from a register of the second data shift circuit belonging to the memory test block $1\_i$ and a determination signal output from the comparison circuit 11 and inputs the same to a register (SF9) of the second data shift circuit belonging to the memory test block $1\_i$.

In this case, each register (SF9) of the second data shift circuit may be 1 bit.

Figure 7:
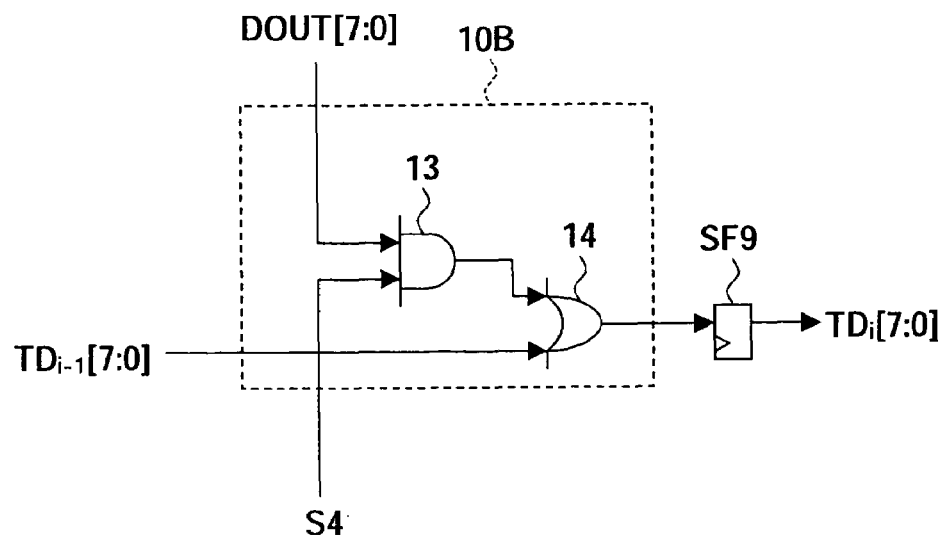
FIG. 7 is a view of a second modified example of a testing output data generation circuit.

The testing output data generation circuit 10B shown in FIG. 7 is an example of the configuration of generating only third testing output data.

The testing output data generation circuit 10B is obtained by omitting the comparison circuit 11 and the selector 12 in the testing output data generation circuit 10 shown in FIG. 2.

In this case, in the AND circuit 13, an AND of each bit of read data DOUT of the memory unit MEM1 and the control signal S4 is calculated.

Also, in the semiconductor integrated circuit in FIG. 1, expected value data generated for each testing input data is shifted by the third data shift circuit and supplied to each of the testing output data generation circuits 10, but the present invention is not limited to this.

Figure 8:
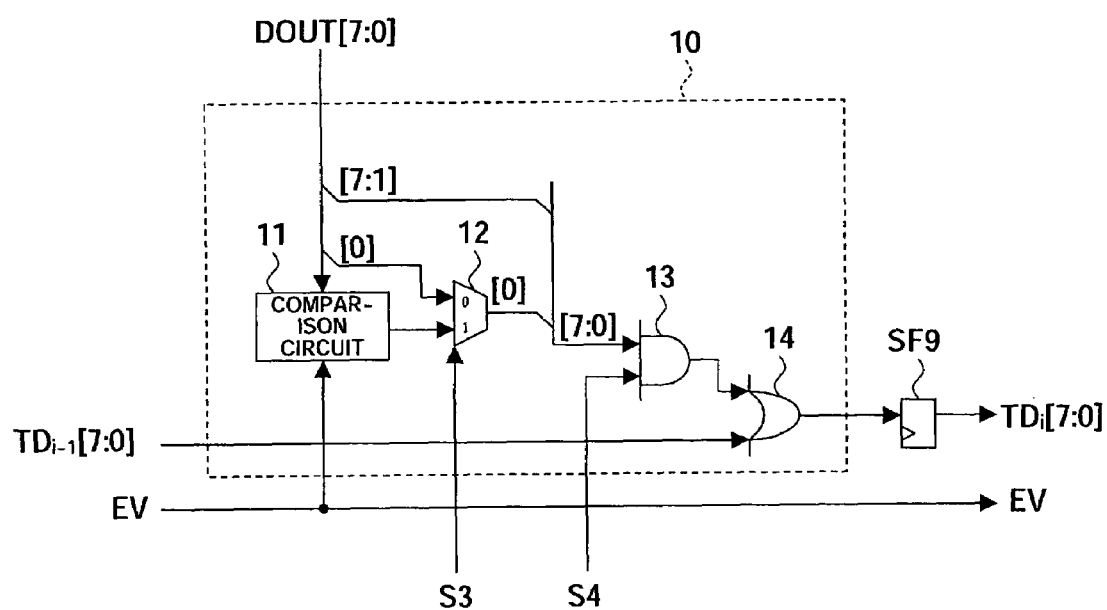
FIG. 8 is a view for explaining a modified example of the present embodiment, wherein a third data shift circuit is omitted.

When a test of each memory unit MEM1 is possible by using expected value data having a constant value regardless of the testing input data, for example, as shown in FIG. 8, the expected value data may be directly input from the testing circuit BT1 to the comparison circuit 11 of each of the testing output data generation circuits 10.

An example of providing a testing circuit in the semiconductor integrated circuit was explained in the above embodiment, but the present invention is not limited to this, and a test of memory units may be conducted by using an external testing circuit of the semiconductor integrated circuit.

In the above embodiment, both the process of generating the testing input data and the process of determining good or bad based on testing output data can be performed in the testing circuit BT1, but the present invention is not limited to this, and, for example, a circuit for performing only one process (a testing input data generation circuit and a determining circuit) may be provided.

The third testing output data generated in the testing output data generation circuit 10 shown in FIG. 2 and read data DOUT of the memory unit MEM1 have an identical value, but the present invention is not limited to this. It is sufficient if the third testing output data is at least in response to the read data DOUT and, for example, data obtained by logically inverting each bit of the read data DOUT of the memory unit MEM1 may be used.

In the testing output data generation circuit 10 shown in FIG. 2, any one of the first to third testing output data is selectively generated by following the control signals S3 and S4, but the present invention is not limited to this. For example, two or three of these data may be generated in parallel and transferring the same to the testing circuit by registers formed by scan flip-flops.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor integrated circuit comprising a plurality of memory units, a logic circuit connected to said plurality of memory units and a plurality of scan flip-flops for carrying out a scan test on said logic circuit;
    a first operation mode for carrying out a test on said memory units, and a second operation mode for accessing to said memory units from said logic circuit being defined;
    a first data shift circuit having a plurality of stages of registers corresponding to said plurality of memory units, for inputting testing input data to a register in a first stage among said plurality of stages and shifting the same to registers in the subsequent stages in said first operation mode; and
    a first selection circuit for selecting said testing input data, shifted and outputted from said respective registers in the corresponding stages in said first operation mode, and selecting data output from said logic circuit in said second operation mode, to determine the data input to the memory units,
    the respective registers of said first data shift circuit being formed by said scan flip-flops.

2. A semiconductor integrated circuit as set forth in claim 1, wherein:
    a third operation mode for carrying out said scan test is furthermore defined;
    said first selection circuit selects output data of said logic circuit as data to be input to said memory units, in said third operation mode, and
    said semiconductor integrated circuit comprises a second selection circuit for selecting said testing input data to be input from said first data shift circuit in said first operation mode, and selecting data to be input from said first selection circuit to the respective memory units in said third operation mode, to determined the data input to the memory units.

3. A semiconductor integrated circuit as set forth in claim 1, comprising:
    a second data shift circuit having a plurality of stages of registers corresponding to said plurality of memory units, for generating testing output data in accordance with data output from each of said memory units in response to said testing input data for each of said plurality of memory units, for making the generated testing output data to be latched by corresponding registers, and for shifting the latched testing output data to registers on subsequent stages;
    wherein the registers in said second data shift circuit are formed by using said scan flip-flops.

4. A semiconductor integrated circuit as set forth in claim 3, wherein:

said second data shift circuit comprises a plurality of testing output data generation circuits corresponding to said plurality of stages of registers;

said testing output data generation circuit corresponding to a register in the first stage of said second data shift circuit, in the first operation mode, generates testing output data having a first value and makes the same latched by the register when a data value output from a memory unit corresponding to the register in response to said testing input data does not match with an expected value, or generates testing output data having a second value and makes the same latched by the register when the output data of the memory unit matches with said expected value; and said testing output data generation circuit corresponding to registers in the subsequent stages of said first stage of said second data shift circuit, in the first operation mode, generates testing output data having said first value and makes the same latched by the register when the data value output from a memory unit corresponding to the register in response to said testing input data does not match with the expected value or when said testing output data to be shifted from a previous stage of the register has said first value, or generates testing output data having said second value and makes the same latched by the register when a value of output data of the memory unit matches with said expected value and said testing output data to be shifted from the previous stage of the register has said second value.

5. A semiconductor integrated circuit as set forth in claim 4, comprising:
a third data shift circuit having a plurality of stages of registers corresponding to said plurality of memory units, for shifting expected value data from a register on a first stage to registers on the subsequent stages successively in said first operation mode;
wherein said testing output data generation circuit corresponding to a register in each stage of said second data shift circuit uses a value of said expected value data to be shift-input to a register in a corresponding stage of said third data shift circuit as said expected value in said first operation mode.

6. A semiconductor integrated circuit as set forth in claim 5, wherein registers of said third data shift circuit are formed by said scan flip-flops.

7. A semiconductor integrated circuit as set forth in claim 4, wherein
when a control signal instructing an invalidation of an output of a test result is input in said first operation mode, said testing output data generation circuit generates said testing output data on an assumption that a data value output from a corresponding memory unit in response to said testing input data has said expected value.

8. A semiconductor integrated circuit as set forth in claim 4, wherein:
said testing output data generation circuit corresponding to a register on a first stage of said second data shift circuit makes data output from a memory unit corresponding to the register in response to said testing input data or data corresponding thereto latched by the register as said testing output data when a control signal instructing a read of an output data of said memory unit is input in said first operation mode; and
said testing output data generation circuit corresponding to registers in the subsequent stages of said first stage of said second data shift circuit makes data output from a memory unit corresponding to the register in response to said testing input data or data corresponding thereto latched by the register as said testing output data when a control signal instructing a read of an output data of said memory unit is input, while makes said testing output data to be shifted from the previous stage of the register latched by the register when a control signal instructing an invalidation of the reading is input.

9. A semiconductor integrated circuit as set forth in claim 3, wherein:
said second data shift circuit comprises a plurality of testing output data generation circuits corresponding to said plurality of stages of registers;
said testing output data generation circuit corresponding to a register on a first stage of said second data shift circuit makes data output from a memory unit corresponding to the register in response to said testing input data or data corresponding thereto latched by the register as said testing output data when a control signal instructing a read of an output data of said memory unit is input in said first operation mode; and
said testing output data generation circuit corresponding to registers in the subsequent stages of said first stage of said second data shift circuit makes data output from a memory unit corresponding to the register in response to said testing input data or data corresponding thereto latched by the register as said testing output data when a control signal instructing a read of an output data of said memory unit is input, while makes said testing output data to be shifted from a previous stage of the register latched by the register when a control signal instructing an invalidation of the reading is input.

10. A semiconductor integrated circuit as set forth in claim 3, comprising:
a testing input data generation circuit for generating said testing input data to be supplied from a first stage of said first data shift circuit in said first operation mode; and
a determination circuit for retrieving a testing output data output from a final stage of said second data shift circuit and determining whether said memory unit is good or bad based on the retrieved testing output data in said first operation mode.

11. A semiconductor integrated circuit as set forth in claim 1, comprising a testing input data generation circuit for generating said testing input data to be supplied to a first stage of said first data shift circuit in said first operation mode.

12. A semiconductor integrated circuit comprising a plurality of memory units, a logic circuit connected to said plurality of memory units and a plurality of scan flip-flops for carrying out a scan test on said logic circuit, comprising:
a data shift circuit having a plurality of stages of registers corresponding to said plurality of memory units, for generating testing output data in accordance with data output from said memory unit in response to said testing input data for each of said plurality of memory units, makes the generated testing output data latched by a corresponding register and shifting the latched testing output data to registers in the subsequent stages successively in an operation mode for carrying out a test of said memory unit by inputting test data to said memory unit;
wherein the respective registers of said data shift circuit are formed by using said scan flip-flops.

13. A semiconductor integrated circuit as set forth in claim 12, comprising a determination circuit for retrieving data output from a final stage of said data shift circuit and determining whether said memory unit is good or bad based on the retrieved data in said operation mode.

* * * * *